United States Patent

Spaeth et al.

[11] Patent Number: 5,875,205
[45] Date of Patent: Feb. 23, 1999

[54] OPTOELECTRONIC COMPONENT AND METHOD FOR THE MANUFACTURE THEREOF

[75] Inventors: Werner Spaeth, Holzkirchen; Wolfgang Gramann, Regensburg; Hans-Ludwig Althaus, Lappersdorf; Ralf Dietrich, Munich, all of Germany

[73] Assignee: Siemens Aktiengesellschaft, Munich, Germany

[21] Appl. No.: 799,494

[22] Filed: Feb. 12, 1997

Related U.S. Application Data

[63] Continuation of Ser. No. 361,512, Dec. 22, 1994, abandoned.

[30] Foreign Application Priority Data

Dec. 22, 1993 [EP] European Pat. Off. ............. 93120734

[51] Int. Cl.⁶ .................................................. H01S 3/19
[52] U.S. Cl. ............................ 372/50; 372/108; 257/82; 257/98; 385/49
[58] Field of Search ............................ 372/50, 101, 108, 372/43; 385/14, 49; 257/98, 82

[56] References Cited

U.S. PATENT DOCUMENTS

| 4,641,023 | 2/1987 | Ando et al. ............................ 250/216 |
| 4,807,238 | 2/1989 | Yokomori ................................ 372/32 |
| 5,255,333 | 10/1993 | Althaus et al. .......................... 385/33 |

FOREIGN PATENT DOCUMENTS

| 0 199 565 A3 | 10/1986 | European Pat. Off. .......... H01S 3/02 |
| 57-84189 | 5/1982 | Japan ...................................... 372/43 |
| 58-97885 | 6/1983 | Japan ................................. H01S 3/18 |
| 62-11286 | 1/1987 | Japan ...................................... 372/43 |
| 62-12181 | 1/1987 | Japan ...................................... 372/45 |
| 2-119275 | 5/1990 | Japan ...................................... 257/98 |
| 2-296388 | 12/1990 | Japan ...................................... 372/43 |
| 3011783 | 1/1991 | Japan ................................. H01S 3/18 |
| 3-105985 | 5/1991 | Japan ...................................... 372/43 |
| 3-142886 | 6/1991 | Japan ...................................... 257/98 |
| 4-162687 | 6/1992 | Japan ...................................... 372/45 |
| 2 213 957 | 8/1989 | United Kingdom ............. G02B 6/26 |

OTHER PUBLICATIONS

Patent Abstracts of Japan—Publication No. JP63265483, publication date Nov. 1, 1988, Haruyoshi Yamanaka et al, "Semiconductor Laser Device".

*Primary Examiner*—Rodney Bovernick
*Assistant Examiner*—Yisun Song
*Attorney, Agent, or Firm*—Hill & Simpson

[57] ABSTRACT

In an optoelectronic component having a laser chip as a light transmitter and a lens coupling optics for defined emission of radiation generated in the laser chip, the lens coupling optics is arranged immediately in front of the laser chip and is adjusted and fixed in stable fashion in a simple way. The component is rationally manufactured in a wafer union. The laser chip is arranged on a common carrier between two carrier parts whose lateral surfaces neighboring the resonator faces of the laser chip are provided with mirror layers, and that are inclined at an angle of 45° relative to the resonator faces. Thus the radiation generated in the laser chip is directed nearly perpendicularly upward to the surface of the common carrier and the lens coupling optics is arranged on at least the one carrier part such that the radiation generated in the laser chip impinges this lens optics nearly perpendicularly.

11 Claims, 1 Drawing Sheet

OPTOELECTRONIC COMPONENT AND METHOD FOR THE MANUFACTURE THEREOF

This is a continuation of application Ser. No. 08/361,512, filed Dec. 22, 1994 now abandoned.

RELATED APPLICATION

The present application is related to copending Hill Firm application No. P-94,3124, titled "TRANSMISSION AND RECEPTION MODULE FOR A BIDIRECTIONAL, OPTICAL MESSAGE AND SIGNAL TRANSMISSION" of Werner Spaeth et al.

BACKGROUND OF THE INVENTION

The invention is directed to an optoelectronic component having a laser chip as a light transmitter and having a lens coupling optics for defined emission of the optical radiation produced in the laser chip. The invention is also directed to a method for the manufacture thereof.

Optoelectronic components having a lens coupling optics are known and are disclosed, for example, by EP-A-0 412 184, corresponding to U.S. Pat. No. 5,255,333.

Such opto-semiconductor components particularly serve as light transmission components for coupling to light waveguides. The known components employed for optical coupling between a semiconductor laser and a light conductor, for example an optical fiber that are particularly employed in optical data and communications technology, usually suffer from the fact that they require expensive discrete components and complicated assembly processes because of the emission of the coherent radiation of the laser chip from the edge thereof, i.e. in the mounting plane thereof.

SUMMARY OF THE INVENTION

An object of the invention is to design an optoelectronic component of the type initially cited such that a lens coupling optics arranged immediately in front of the laser chip can be adjusted and fixed in stable fashion in a simple way. It is also an object of the invention to specify an especially rational method for the manufacture that enables both a simplified mounting of the laser chip as well as of the mechanical connecting elements and optical imaging elements in the wafer union.

According to the invention, an opto-electronic component is provided having a laser chip as a light transmitter and a lens coupling optics for defined emission of radiation generated in the laser chip. The laser chip is arranged on a common carrier between two carrier parts whose lateral surfaces neighboring the resonator faces of the laser chip are provided with mirror layers that are inclined at an angle of 45° relative to the resonator faces. Radiation generated in the laser chip is directed nearly perpendicularly upward to a surface of the common carrier by the mirror layers. The lens coupling optics is arranged and secured on the at least one carrier part such that the radiation generated in the laser chip impinges this lens coupling optics nearly perpendicularly.

The advantages achieved with the invention are particularly that the optoelectronic component comprises a structure that, utilizing components and techniques of micromechanics and micro-optics, allows both a simplified mounting of the laser chip on a submount as well as an especially rational manufacture of a multitude of such components in the wafer union. All mechanical connecting elements and optical imaging elements as well as the laser chips can thereby be simultaneously mounted and then detached. The optoelectronic component is distinguished by a space-saving structure, a mechanically stable lens coupling optics, and a defined emission characteristic.

The invention shall be set forth in greater detail below with reference to an exemplary embodiment shown in the drawings.

DESCRIPTION OF THE PREFERRED EMBODIMENTS

Figure 1:
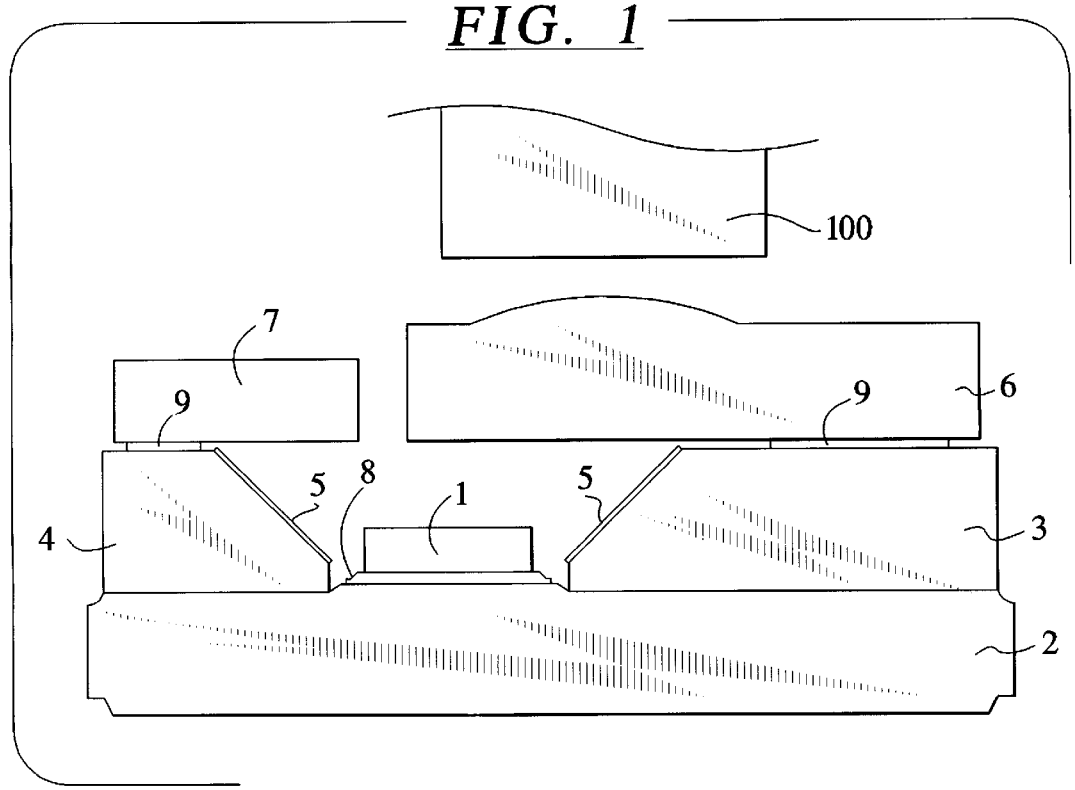
FIG. 1 is an optoelectronic component in section.
Figure 2:
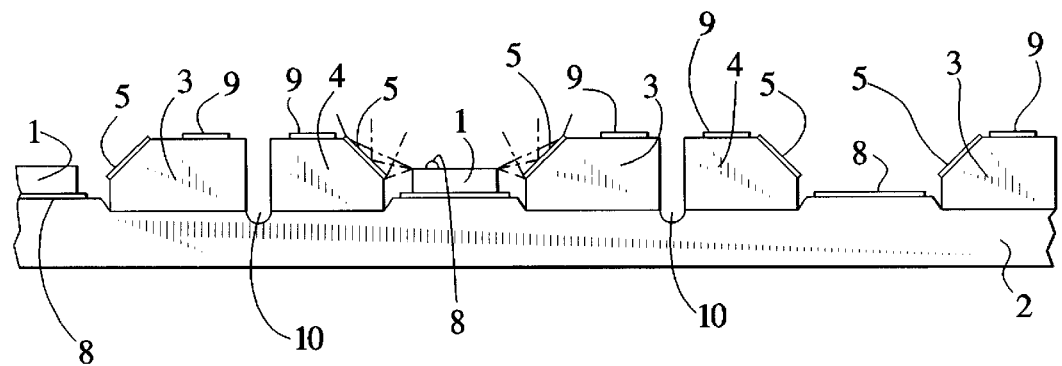
FIG. 2 shows an optoelectronic component during manufacture in a wafer union.

The optoelectronic component shown as a discrete component in FIG. 1 and shown in the wafer union in FIG. 2 is essentially composed of a laser chip 1 as a light transmitter, and of a lens coupling optics 6 for the defined emission of the optical radiation generated in the laser chip. The laser chip 1 is arranged on a common carrier 2 that is preferably composed of silicon and, as a submount, can be mounted on, for example, the bottom plate of a TO housing. The laser chip 1 is arranged on the common carrier 2 between two carrier parts 3, 4 whose side faces neighboring the optical resonator surfaces of the laser chip 1 are provided with mirror layers 5 and are inclined at an angle of 45° relative to the resonator surfaces, so that the coherent radiation generated in the laser chip 1 is deflected nearly perpendicularly upward to the surface of the common carrier 2. The two carrier parts 3, 4 are preferably composed of glass and have a trapezoidal profile. It is advantageous particularly for simplifying the adjustment and fastening of these two carrier parts 3, 4, to provide depressions or trenches matingtherewith in the common carrier 2, the carrier parts 3, 4 being then introduced thereinto and secured therein. Layers of dielectric material are expediently applied onto the neighboring lateral surfaces of the carrier parts 3, 4 as mirror layers 5. The lens coupling optics 6 is arranged and secured on at least the one carrier part (the carrier part 3 in this exemplary embodiment), such that the radiation generated in the laser chip 1 impinges the optics 6 nearly perpendicularly.

The lens coupling optics 6 is preferably a lens chip having an integrated refractive and/or diffractive lens. This lens chip or the lens coupling optics 6 can also be adjusted and fixed on both carrier parts 3, 4 spanning the laser chip 1. Dependent on the wavelength emitted by the laser chip 1, the lens chip 1 is expediently composed of a correspondingly transmissive glass or semiconductor material such as silicon, silicon carbide, or gallium phosphide. The lens chip, which can be arranged one-sided on only one carrier part or both-sided on both carrier parts 3, 4 as lens coupling optics 6, is advantageously applied and secured onto the one or onto both carrier parts 3, 4 with its structured and/or curved side down, i.e. having this side facing toward the laser chip 1. Such an arrangement, in particular, is more tolerance-friendly than an arrangement having an outer curvature or structure. For example, a spherical lens or cylinder lens that is secured in an opening in a lens carrier that, for example, is composed of silicon, can also be employed as a lens coupling optics 6 instead of a lens chip having an integrated lens.

For specific applications of the optoelectronic component, a monitor chip 7 is expediently arranged and secured on the one or on both carrier parts 3, 4 or on the lens chip (insofar as this is applied on both carrier parts 3, 4). It is arranged and secured such that a part of the optical radiation generated by the laser chip can be received by this monitor chip 7. In this example, the monitor chip 7 is secured on the carrier part 4 and receives the laser backside light emitted by the laser chip 1 and reflected by the mirror 5.

According to an especially advantageous embodiment of the optoelectronic component of the invention that can be multiply manufactured in a wafer unit at the same time, a wafer preferably composed of silicon is provided, according to FIGS. 1 and 2, with suitable metallic structures 8 for bonding the laser chip 1 to common carrier 2 (submount). Parallel depressions or trenches having a width and spacing, for example, of a few 100 $\mu$m are expediently etched in this carrier 2. The trench depth can amount from one through a few 100 $\mu$m. Carrier parts 3, 4, preferably having the shape of prism stripes with a trapezoidal profile wherein the extensions of the two lateral surfaces intersect at a right angle are directly introduced into the depression or onto the common carrier 2 and are bonded anodically or with a soldering technique. The neighboring lateral surfaces of the carrier parts 3, 4 are provided with mirror layers 5. Dielectric mirrors of layer sequences such as $SiO_2$—$TiO_2$, $SiO_2$—Si, $Al_2O_3$—Si or combinations of these layer sequences and other dielectric layers are advantageously applied. The narrower upper side of the prismatic carrier parts 3, 4 can be provided with a solderable metal layer structure 9 of, for example, Ti—Pt—Au, Cr—Pt—Au, Ti—Ni—Au, Ti—Pt—AuSn, Ni—Au or other solderable layers.

For constructing the laser unit or the optoelectronic component, the laser chips 1 which, dependent on the requirements have their underside facing toward the carrier 2 provided with a solder layer of AuSn, AuGe, AuSi, PbSn or other solderable layers having a thickness of approximately 1 $\mu$m through 10 $\mu$m, are now soldered onto the metal pads or, respectively, metallic structures 8 provided on the common carrier part (Si-submount) at a defined spacing in front of the carrier parts 3, 4. The required energy for the soldering can be introduced into the underside of the laser chip 1 to be secured on the basis of various methods such as high-frequency heating, WIG heating, heatpipe-heating or by laser emission. It is advantageous to pre-heat the common carrier 2 (preferably the silicon wafer) such that the temperature required for the soldering process is achieved with little additional energy. In order to keep this especially low, the outflow of the supplied energy to the neighboring chips can be greatly reduced with specific techniques, for example incisions between the individual laser chips 1 that can proceed from their undersides up to the carrier parts 3, 4. The upper side of the laser chips 1 is connected to a pad provided for this purpose on the common carrier 2.

The specific embodiment of the laser submount, i.e. of the common carrier 2, with reflective, prism-shaped carrier parts 3, 4 for beam deflection, now makes it possible to utilize the testing on a standard wafer tester having only one additional optical measuring head for acquiring the optoelectronic quantities that are standard in semiconductor technology but have hitherto not been capable of being employed given known laser edge-emitters.

After the measurement, the wafer can be optionally separated into the individual submounts (carrier 2), whereby each submount (carrier 2) contains one laser chip 1 and a respective part of the prism-shaped carrier parts 3, 4 in front of the front and back side of the laser chip 1. The separation of the wafer or the detachment of the components or of their submounts occurs along the separating tracks 10 according to FIG. 2. The division of the wafer, preferably a silicon wafer (carrier 2) into individual submounts can also have already been undertaken before the mounting of the laser chips 1. The submounts can then be individually further-processed.

Before or after the detachment of the submounts, a lens coupling optics 6 (in the form of a lens chip here whose lens can be refractive and/or diffractive) is then actively or passively (i.e., with or without laser operation as an auxiliary) adjusted in the x-direction and the y-direction over the mirror layer 5 of the carrier part 3 in front of the front side of the laser chip 1, and is expediently secured on the surface of the carrier part 3 with soldering or gluing. The required energy for the soldering can be introduced into the lens chip, for example, by a direct current heating of the lens chip or by radiant heating with a laser (semiconductor power laser, solid-state laser, $CO_2$ laser, etc.). The necessary solder can be applied onto the lens chip by, for example, vapor-deposition, this solder then being melted for fixing under a pressure contact with the substrate (carrier part 3). The thermal resistance of the carrier part 3, for example a glass prism, is dimensioned such that only an insignificant heating of the material of the carrier 2, for example the Si substrate, occurs during the soldering process.

The sum of the spacings between the front side of the laser chip 1 and the carrier part 3, between the carrier part 3 and the lens chip 6, and the optical thickness of the lens in the lens chip 6 yields the subject-to-lens distance of the optical imaging. Given a fixed spacing between the carrier part 3 and the lens chip 6 and a fixed optical thickness of the lens in the lens chip 6, this can be set or varied solely via a lateral displacement, i.e. via a modification of the spacing of the front side of the laser chip 1 from the carrier part 3, being set toward this or away from this. The z-adjustment has thus been transformed into a simple lateral adjustment. The imaging of the laser spot onto the core of an optical fiber that is located at a prescribed distance in front of the lens of the lens chip 6 can thus be set in an extremely simple way.

The lens chips that are employed can be manufactured in a wafer process with specific photolithographic and etching-oriented processes. The lens material is selected dependent on the technical demands. Silicon is advantageously employed for wavelengths longer than 1.1 $\mu$m. Special glasses or semiconductor materials such as, for example, gallium phosphide or silicon carbide are advantageously employed for shorter wavelengths. Silicon, however, can also only be the carrier for lenses. The employment of silicon yields an especially stable structure with respect to temperature changes since the common carrier 2 (submount), carrier parts 3, 4 (for example, glass prisms) and lens coupling optics 6 (lens chips) have nearly the same coefficient of expansion in the temperature intervals that come into consideration.

If required, a suitable monitor diode 7 can be applied on the upper side of the one carrier part 4 that lies opposite the carrier part 3 carrying the lens coupling optics 6. It is applied in such a way that a part of the diode projects over the mirror layer 5 applied on the carrier part 4. The photons (backside light) that emerge from the back mirror (back resonator side) of the laser chip 1 and that are reflected upwardly at the neighboring mirror layer 5 can thus reach the pn-junction of the monitor diode via the transparent substrate of the monitor chip 7. Given monitor diodes that do not have a transparent substrate, the diode is applied onto the carrier part 4 with its pn-junction down. The monitor chip 7, however, can also be arranged over the lens coupling optics 6 or can be integrated therein, insofar as, for example, a lens chip extends over both carrier parts 3, 4.

After optoelectronic testing, the common carriers 2 (submounts) on which laser chip 1, carrier parts 3 and 4, lens coupling optics 6, and monitor chip 7 are located, i.e., the micromodules, can be mounted on an overall carrier, for example the bottom plate of a TO housing, that has been provided. They are mounted like a standard semiconductor chip in die-bonding and wire-bonding technique.

It is advantageous to provide the light entry face of the monitor diode 7 and the lens coupling optics 6, particularly the lens, with an optical coating for reducing reflection losses.

Although various minor changes and modifications might be proposed by those skilled in the art, it will be understood that we wish to include within the scope of the patent warranted hereon all such changes and modifications as reasonably come within our contribution to the art.

We claim as our invention:

1. An optoelectronic component for optical coupling between a semiconductor laser and a light conductor, comprising:

a common carrier having two separate carrier parts separate from and mounted on the common carrier with a laser chip as a light transmitter in between the two carrier parts on the common carrier;

said two carrier parts having lateral surfaces neighboring resonator faces of the laser chip, and respective mirror layers on the lateral faces which are inclined substantially at an angle of 45° relative to the resonator faces of the laser chip so that radiation generated in the laser chip is directed nearly perpendicularly upward from near a surface of the common carrier;

a lens coupling optics formed as a separate lens chip for defined emission of radiation generated in the laser chip into said light conductor, said lens chip being arranged and secured on one of the carrier parts so that radiation generated in the laser chip impinges the lens chip substantially perpendicularly, said common carrier, said carrier parts and said lens chip having nearly a same coefficient of expansion, and said lens chip being formed of one of the elements selected from the group consisting of glass and semiconductor material;

the two carrier parts being inserted into respective depressions in the common carrier; and a monitor chip arranged and secured on the carrier part on which the lens chip is not arranged and in a position so that a portion of the optical radiation generated by the laser chip is received by the monitor chip.

2. A component according to claim 1 wherein the common carrier is formed of silicon.

3. A component according to claim 1 wherein the two carrier parts are formed of glass and have a trapezoidal profile.

4. A component according to claim 1 wherein the two carrier parts are formed of silicon and have a trapezoidal profile.

5. A component according to claim 1 wherein the mirror layers on the respective lateral surfaces of the respective two carrier parts are layers of dielectric material.

6. A component according to claim 1 wherein the lens chip has an integrated refractive lens.

7. A component according to claim 1 wherein the lens chip has an integrated defractive lens.

8. A component according to claim 1 wherein the lens chip is formed of a material selected from the group consisting of silicon, silicon carbide, gallium phosphide, and glass.

9. A component according to claim 1 wherein a monitor chip is arranged relative to the carrier so that a portion of radiation generated by the laser chip is received by the monitor chip.

10. An optoelectronic component for optical coupling between a semiconductor laser and a light conductor, comprising:

a common carrier having two separate carrier parts separate from and mounted on the common carrier with a laser chip as a light transmitter in between the two carrier parts on the common carrier;

said two carrier parts each being shaped as trapezoids and having lateral surfaces neighboring resonator faces of the laser chip, and respective mirror layers on the lateral faces which are inclined at an angle of approximately 45° relative to the resonator faces of the laser chip so that radiation generated in the laser chip is directed upwardly and away from the common carrier;

a lens coupling optics formed as a lens chip for defined emission of radiation generated in the laser chip into said light conductor, said lens chip being arranged and secured on one of the carrier parts so that radiation generated in the laser chip impinges the lens chip, said carrier parts and said lens chip having nearly a same coefficient of expansion, and said lens chip being formed of one of the elements selected from the group consisting of glass and semiconductor material;

the two carrier parts being inserted into respective depressions in the common carrier; and a monitor chip arranged and secured on the carrier part on which the lens chip is not arranged and in a position so that a portion of the optical radiation generated by the laser chip is received by the monitor chip.

11. An optoelectronic component, comprising:

a common carrier formed of silicon having two trapezoidal-shaped carrier parts on the common carrier with a laser chip as a light transmitter in between the two carrier parts on the common carrier;

said two carrier parts having lateral surfaces neighboring resonator faces of the laser chip, and respective mirror layers on the lateral faces which are inclined substantially at an angle of 45° relative to the resonator faces of the laser chip so that radiation generated in the laser chip is directed nearly perpendicularly upward from near a surface of the common carrier;

a lens coupling optics for defined emission of radiation generated in the laser chip, said lens coupling optics being arranged and secured on one of the carrier parts so that radiation generated in the laser chip impinges the lens coupling optics substantially perpendicularly;

the two carrier parts being inserted into respective depressions in the common carrier; and a monitor chip arranged and secured on the carrier part on which the lens chip is not arranged and in a position so that a portion of the optical radiation generated by the laser chip is received by the monitor chip.

* * * * *